US009496675B1

(12) United States Patent
Plummer et al.

(10) Patent No.: US 9,496,675 B1
(45) Date of Patent: Nov. 15, 2016

(54) METHOD AND REFLECTIVE APPARATUS FOR COMBINING HIGH-POWER LASER BEAMS

(71) Applicants: William T. Plummer, Concord, MA (US); Aland K. Chin, Sharon, MA (US)

(72) Inventors: William T. Plummer, Concord, MA (US); Aland K. Chin, Sharon, MA (US)

(73) Assignee: Science Research Laboratory, Inc., Somerville, MA (US)

( * ) Notice: Subject to any disclaimer, the term of this patent is extended or adjusted under 35 U.S.C. 154(b) by 137 days.

(21) Appl. No.: 14/324,737

(22) Filed: Jul. 7, 2014

Related U.S. Application Data

(60) Provisional application No. 61/844,083, filed on Jul. 9, 2013.

(51) Int. Cl.
   *G02B 6/42* (2006.01)
   *H01S 3/094* (2006.01)
   *H01S 3/067* (2006.01)

(52) U.S. Cl.
   CPC ............... *H01S 3/094* (2013.01); *H01S 3/067* (2013.01)

(58) Field of Classification Search
   None
   See application file for complete search history.

(56) References Cited

U.S. PATENT DOCUMENTS

| 5,513,201 | A | 4/1996 | Yamaguchi et al. |
| 5,933,278 | A * | 8/1999 | Plummer ............ G02B 27/1073 359/627 |
| 7,738,178 | B2 | 6/2010 | Bartoschewski et al. |
| 2003/0138021 | A1* | 7/2003 | Hodgson et al. .............. 372/75 |
| 2004/0067016 | A1* | 4/2004 | Anikitchev et al. ............ 385/34 |
| 2006/0227822 | A1* | 10/2006 | Goodno et al. ................ 372/26 |
| 2011/0110626 | A1* | 5/2011 | Aschke et al. ................. 385/33 |

OTHER PUBLICATIONS

Summers. "Generation of a Single-Lobe, Far-Field Intensity Pattern from a Laser Diode Array Using an Optical Delay Line." Air Force Institute of Technology. Thesis. 1994.
Zhang. "Beam Collimation and Intensity Uniformization of Laser Diode Array Using Lenslets." Auburn University. Thesis. 2013.

* cited by examiner

*Primary Examiner* — Ryan Lepisto
*Assistant Examiner* — Erin Chiem
(74) *Attorney, Agent, or Firm* — Burns & Levninson LLP; Orlando Lopez

(57) ABSTRACT

Systems and methods that accept the emitted radiant power from such a combined diode laser structure (laser bar stack) and efficiently direct essentially all of it into the pump cladding of a double-clad fiber amplifier, such that the radiant power will then be absorbed by a rare-earth doped core in the active fiber.

14 Claims, 8 Drawing Sheets

Example: Far-field of collimated 6-bar stack

BPP$_{FA}$ ~19.5mm-mrad          BPP$_{FA}$ ~107mm-mrad 2.6 mm bar spacing

METHOD AND REFLECTIVE APPARATUS FOR COMBINING HIGH-POWER LASER BEAMS

CROSS REFERENCE TO RELATED APPLICATIONS

This application claims priority to and benefit of U.S. Provisional Application No. 61/844,083, entitled METHODS AND REFLECTIVE APPARATUS FOR COMBINING HIGH-POWER LASER BEAMS, filed on Jul. 9, 2013, which is incorporated by reference herein in its entirety and for all purposes.

BACKGROUND

These teachings relate generally to applying high pumping power to a fiber amplifier.

A popular fiber amplifier structure, shown in FIG. 1, comprises a single mode core, doped with an active lasing material, surrounded by a larger multimode cladding of lower refractive index to contain and direct pump radiation into the active core, and itself surrounded with a lower index cladding to prevent radiation loss from the combination.

The fiber amplifier structure can be pumped with input radiation passing into one or both ends of the multimode cladding surrounding the active single mode core in a standard manner.

But pump radiation can be introduced into the multimode pump cladding more effectively and without blocking laser radiation emitted by the single mode core by use of a plurality of tapered multimode fibers fused to the pump cladding, as shown in FIG. 2.

A conventional optical pumping scheme includes optical pumping of a high-power fiber amplifier or laser using a 19:1 tapered fused coupler where each input fiber receives its power from an individual 100 W fiber-coupled module. This conventional optical pumping scheme has the disadvantages of greater complexity, size and weight than are needed with the present invention.

Another conventional exemplary scheme includes optical pumping of a high-power fiber laser using a (6+1):1 tapered fused coupler with two laser bar stacks. The beam from each stack is split into three parts, and each part is then coupled into an optical fiber for pumping. This conventional pumping scheme has greater size and weight, is less mechanically stable than is desirable, is degraded by scattering of light at the lens that splits the beam, and is subject to heat distortion of that lens.

An additional conventional use of a tapered fused coupler for pumping a fiber laser also is larger and heavier than is desirable, is limited in input power by thermal problems at the splitter, loses efficiency at the splitter, and is degraded with unwanted power transmitted into the cladding of its output fibers.

Many types of lasers have been considered as a source of radiant power for pumping a fiber amplifier, including gas, dye, solid rod, and diode lasers. Of these options, the diode laser offers substantially the best cost and portability for high power Diode lasers produce output power most efficiently when constructed with an emitting region approximately a micron thick and formed with an output width of about 100 microns. For efficient manufacture several such lasers can be placed along a single semiconductor surface, forming a line source (laser diode bar) with multiple emitting facets. Several such laser diode bars can be stacked together vertically in the form of a stack having dozens or hundreds of emitting facets in a two dimensional array, as shown in FIG. 3.

There is a need for systems and methods for accepting the emitted radiant power from such a simple, single combined diode laser structure (laser bar stack) and efficiently directing essentially all of it into the pump cladding of a double-clad fiber amplifier.

BRIEF SUMMARY

Systems and methods that accept the emitted radiant power from such a combined diode laser structure (laser bar stack) and efficiently direct essentially all of it into the pump cladding of a double-clad fiber amplifier, such that the radiant power will then be absorbed by a rare-earth doped core in the active fiber are disclosed herein below. It is known that power can be introduced to the pump cladding of a fiber amplifier either directly, using free-space optics, into the end of the active fiber structure or by the use of a tapered fused fiber combiner (TFC) attached to the end of the active fiber. The TFC has separate fibers for the pump light and the signal light to be amplified. The TFC is the preferred method since coupling of both the signal source and pump source is more stable mechanically.

The systems of these teachings keep system manufacturing costs low by reducing or eliminating the number of adjustments needed to achieve efficient coupling of the pump source, i.e. laser bar stack, to the input fibers of a TFC. Known methods could be used for optically coupling a plurality of individual laser diode emitters each to one of the input pump fibers, but that approach would sacrifice the manufacturing advantage of combining the many laser diodes within a laser bar stack. These teachings make use of a new optical technique to divide the combined radiant output from the assembled laser bar stack in a way that provides efficient coupling of the divided output beams into a plurality of input pump fibers, keeping the amount of power in each pump fiber below its threshold of damage, but allowing all of the power to reach the active fiber.

In one or more embodiments, the method of these teachings includes separating, by means of a monolithic reflective component having a number of separately tilted reflective areas, collimated electromagnetic radiation from a laser diode bar stack into a number of separated reflected beams, directing, by means of the separately tilted reflective areas, each one of the separated reflected beams in a different one of a number of different directions, and optically imaging each one of the separated reflected beams into a numerical aperture of an input end of a separate one pump fiber from a number of pump fibers, the pump fibers transferring radiation optically imaged into the physical and numerical aperture of the input end of each pump fiber in order to pump an active area of a laser. In one instance, the laser being pumped is a fiber laser and the radiation is transferred to an active fiber.

In one or more embodiments, the system of these teachings includes a laser diode bar stack having a number of laser diode facets, an optical component optically disposed to substantially collimate radiation from each of the laser diode facets and form a single image, a monolithic reflective component having a number of separately tilted areas; the single image being formed onto the number of separately tilted areas; the separately tilted areas separating radiation from the single image into a number of separated reflected beams and directing each one of the separated reflected beams in a different one of a number of different directions, a number of optical fibers, an optical subsystem optically disposed to image each one of the separated reflected beams into a numerical aperture of a separate one optical fiber from the number of optical fibers, the optical (also referred to as "pump") fibers transferring radiation optically imaged into the numerical aperture of the input end of each pump fiber in order to pump an active area of a laser. In one instance, the laser being pumped is a fiber laser and the radiation is transferred to an active fiber.

For a better understanding of the present teachings, together with other and further needs thereof, reference is made to the accompanying drawings and detailed description and its scope will be pointed out in the appended claims.

DETAILED DESCRIPTION

The following detailed description presents the currently contemplated modes of carrying out the invention. The description is not to be taken in a limiting sense, but is made merely for the purpose of illustrating the general principles of the invention, since the scope of the invention is best defined by the appended claims.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about."

In one or more embodiments, the method of these teachings includes the steps of: assembling the multiple laser diode emitting regions into a laser bar stack, collimating the radiation from all the component laser facets using fast-axis and slow-axis micro-lenses, accepting the collimated radiation from all the component laser facets into a suitable lens to form a single image, preferably of the collective far field, onto a special monolithic reflective component, by means of separately tilted areas within the special reflective component, directing the reflected beams of radiation into a plurality of different directions, and optically imaging each of the separated reflected beams into the core and numerical aperture of an input pump fiber.

The plurality of input pump fibers then transfer the radiant power they contain into the cladding of the active fiber through their fused attachments to the cladding of the double-clad active fiber.

Figure 1:
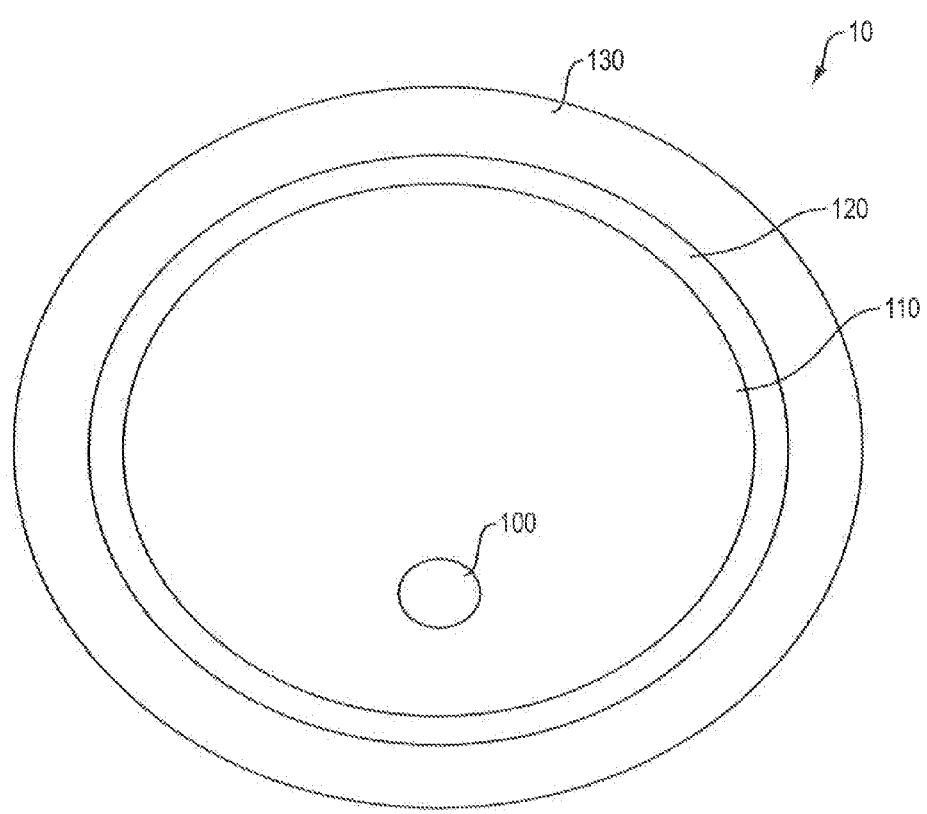
FIG. 1 is a conventional double clad fiber.
Figure 2:
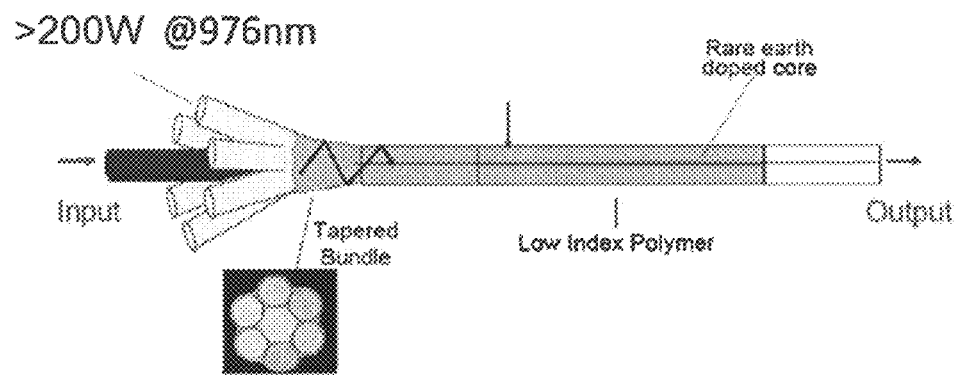
FIG. 2 is a conventional fiber pumping configuration.
Figure 3:
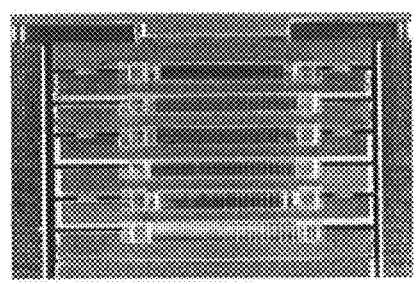
FIG. 3 is a conventional laser diode stack.
Figure 3:
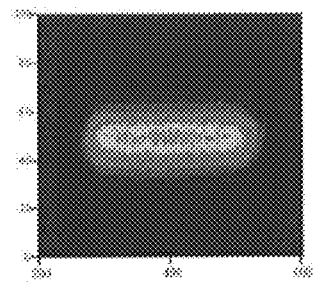
Figure 3:
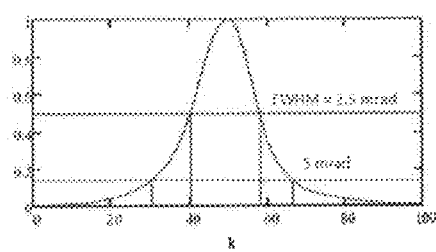
Figure 3:
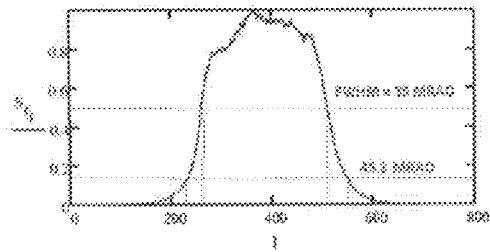
Figure 4A:
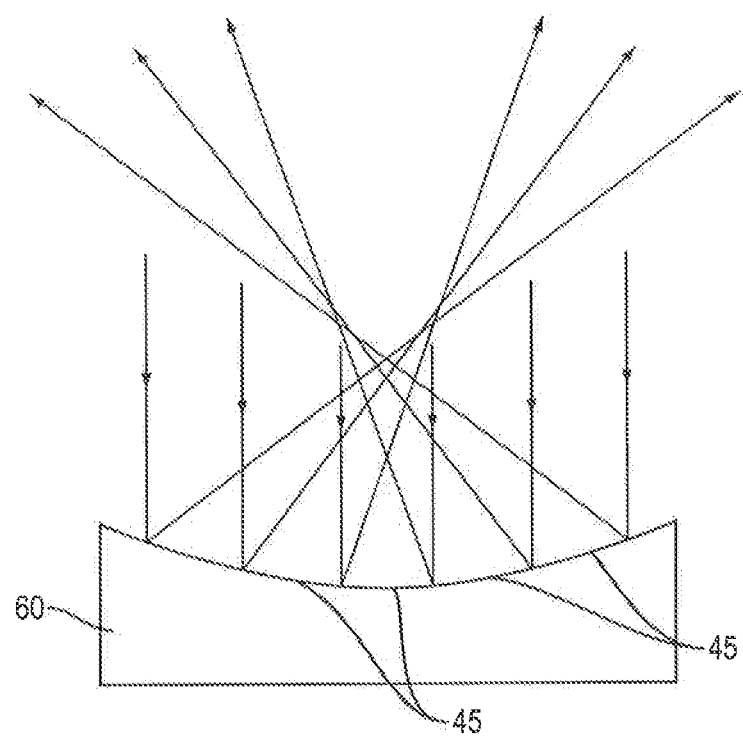
FIGS. 4a, 4b are schematic representations of one embodiment of a component of the system of these teachings.
Figure 4B:
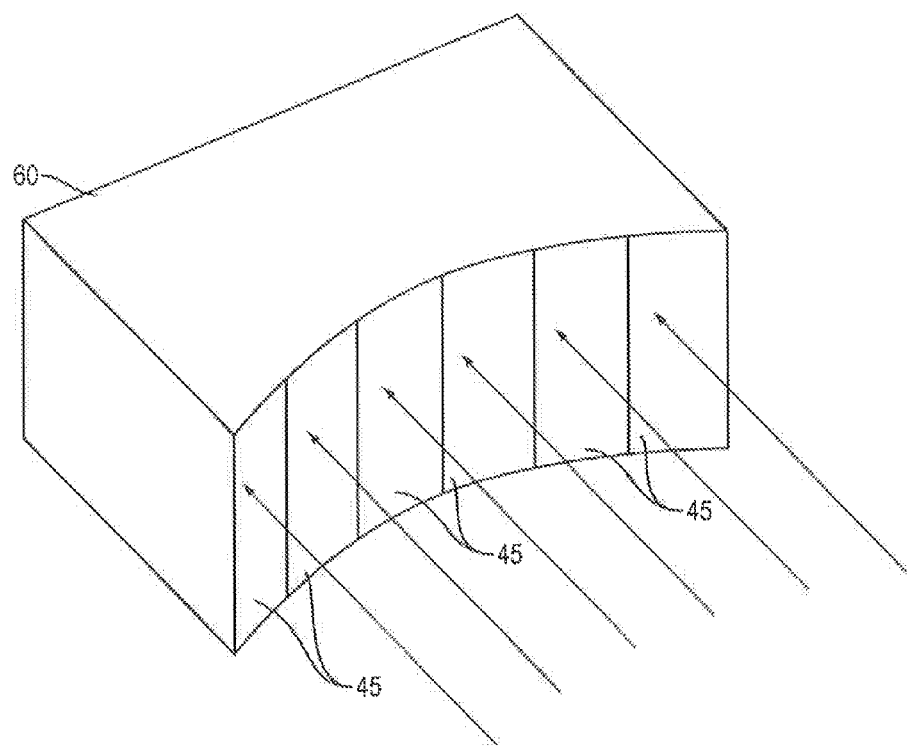

In one instance, to keep the entire system as compact as possible, the special reflective component preferably has its plurality of separately tilted areas arranged in a generally concave configuration, as shown in FIGS. 4a, 4b. Exemplary embodiments are presented herein below in order to further elucidate these teachings. It should be noted that these teachings are not limited by the exemplary embodiments. The individual slopes of the reflective sections in the exemplary embodiment shown in FIG. 4a are chosen to be 7.5°, 15°, and 22.5°, giving reflected beam directions of 15°, 30°, and 45° from the central axis. These reflective sections may be flat, or may be formed with a slight curvature if that is convenient for manufacture or is desired to control optical image formation. The slope configuration can alternatively be generally convex, with the outer sections reflecting away from the central axis, or the slopes may be alternated in a zig-zag manner.

The reflective component 60 with its plurality of reflecting facets 45 is preferably machined by single-point diamond turning or by diamond fly-cutting in one piece of metal, such as aluminum, silver, or gold, with provision for liquid cooling structures as necessary to avoid damage from the incident radiation. Alternatively the reflective component can be made by casting, molding, electroforming, broaching, hobbing, assembly of geometrically simpler components, or by any other known process. The reflective component must have a highly reflective surface and must have high thermal conductivity for effective heat removal.

The radiant image formed on the receiving core of each of the pump fibers 70 may be the near field or the far field of the corresponding reflected portion of the combined laser source, or some compromise between these extremes. The choice is made by the selection and arrangement of relay lenses 80 placed between the monolithic reflective component and the pump fiber core, using known lens design art.

Figure 5:
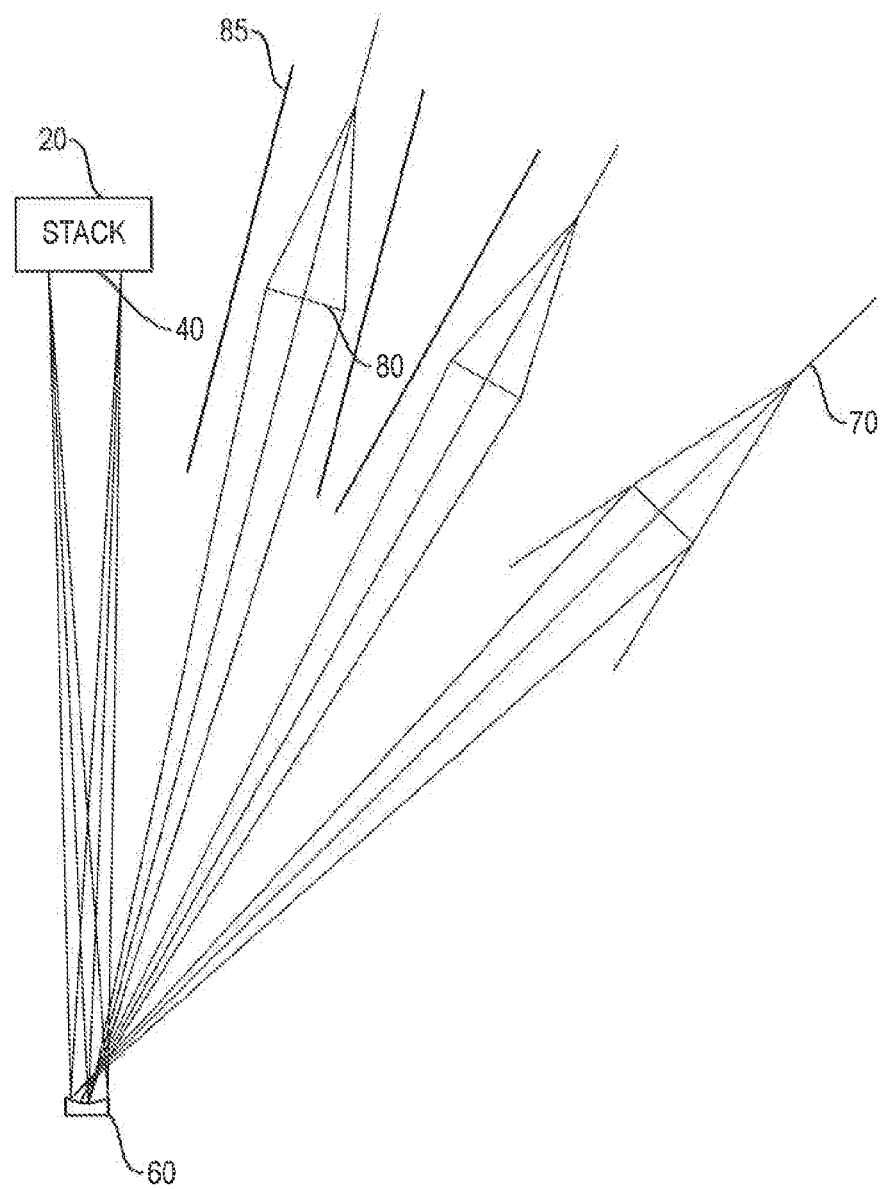
FIG. 5 is a schematic representation of one embodiment of another component of the system of these teachings.

In the exemplary embodiment illustrated in FIGS. 4a, 4b, 5, the far field of the combined laser source is imaged onto the faceted surface of the special reflective component. In the embodiment illustrated in FIG. 5, relay lenses 80 are arranged to image a single reflective facet of the monolithic component, and therefore its part of the far field, onto each of the pump fibers 70. One side of the system is shown, to represent both. In one instance, these teachings not being limited only to that instance, the image formation is telecentric.

In the exemplary embodiment illustrated in FIGS. 4a, 4b, the laser bar stack is immediately followed by a positive lens of 100 mm focal length (not shown) that forms an image of the combined far field of radiation onto the special reflective component, in this case divided into six sections having different slopes. The 100 mm focal length positive lens is shown as 40 in FIG. 5. The full width of the far field image is 4.5 mm and each of the six parts is taken to be 0.75 mm wide, in the plane of the Figure. In this example the out-of-plane dimension of the far field image is 0.5 mm.

Each of the reflected beams may be directed to a positive lens 80 to re-image its section of the far field onto the input end of an individual pump fiber 70, as shown in FIG. 5. If the fibers have a core diameter of 200μ, a magnification factor of 0.215 will fit each section of the far field image onto the core diameter of its respective fiber. All of the lenses used in this system should be fabricated of a material that can withstand high optical power, such as, but not limited to, fused quartz.

With the laser bar width of 9.5 mm, the far field image formed onto the special reflective component by the 100 mm lens has a Numerical Aperture of 0.047 in the plane of the Figure, and so does each of the reflected beams. With the 0.215 magnification the Numerical Aperture at the final image increases to 0.219, just within the 0.22 acceptance Numerical Aperture of the pump fibers.

In this exemplary embodiment, the laser bar stack 20 has an out-of-plane dimension of 15.6 mm. This larger dimension gives a Numerical Aperture of 0.0778 at the special reflective component, then 0.362 at the fiber core after the 0.215 magnification. That angular size is greater than the acceptance NA of the fiber, so some radiation would be lost.

Because the out-of-plane dimension of the far field image is smaller than the in-plane dimension, and because most of its power is confined to the central 0.25 mm region, one can greatly improve this geometric fitting of the laser power into the fibers by putting in cylindrical lenses (not shown) as needed to make the far field image anamorphic. The situation is greatly improved if the far field image size is about doubled in the out-of-plane dimension. There are many lens design options to make that change, but it is preferable to combine some positive cylindrical power in the original 100 mm lens, so that its out-of-plane focal length becomes, for example, 50 mm. A negative cylindrical lens (not drawn) is then placed 16.7 mm before that astigmatic image is formed, and brings the far field image back into focus on the special reflective component, but with twice the original magnification. Other lens placements can have the same result.

Doubling the out-of-plane size of the far field image reduces its NA from 0.362 to 0.181, comfortably within the 0.22 acceptance NA. Because the six far field image segments are rectangular, and the beam NA for each image will be essentially rectangular, the most efficient power delivery into the pump fibers can be achieved by making small adjustments in the 0.215× magnification and in the 2.× magnifications calculated here. Essentially all of the power received at the special reflective component can be coupled into the six pump fibers.

To achieve manufacturing simplicity each relay lens or set of relay lenses may be mounted in a cylindrical cell 85 (indicated) that also holds and positions the input end of a pump fiber 70, all arranged along a single axis. The lens (an embodiment of an optical component or subsystem) 40 used to image the combined laser source 20 onto the monolithic reflective component 60 can also be mounted in a cylindrical cell. All of these cells can be positioned and attached into machined vee-shaped receiving structures on a single base plate, formed at angles appropriate to the respective facet angles of the monolithic reflector, thereby eliminating the need for most system adjustments.

In one or more embodiments, the system of these teachings includes a laser diode bar stack 20 having a number of laser diode facets, an optical component 40 optically disposed to substantially collimate radiation from each of the laser diode facets and form a single image, a monolithic reflective component 60 having a number of separately tilted areas 45; the single image being formed onto the number of separately tilted areas; the separately tilted areas separating radiation from the single image into a number of separated reflected beams and directing each one of the separated reflected beams in a different one of a number of different directions, a number of optical fibers 70, an optical subsystem 80 optically disposed to image each one of the separated reflected beams into a numerical aperture of a separate one optical fiber from the number of optical fibers, the pump fibers transferring radiation optically imaged into the numerical aperture of the input end of each pump fiber in order to pump an active area of a laser. In one instance, the laser being pumped is a fiber laser and the radiation is transferred to an active fiber.

Figure 6A:
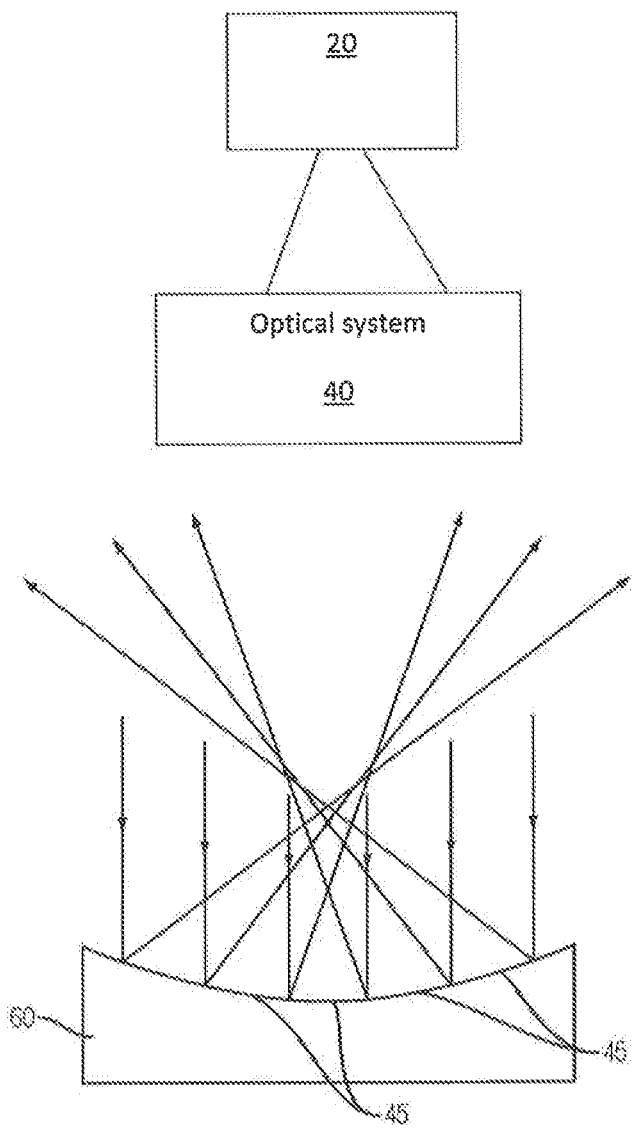
FIGS. 6a, 6b represent one embodiment of the system of these teachings.
Figure 6B:
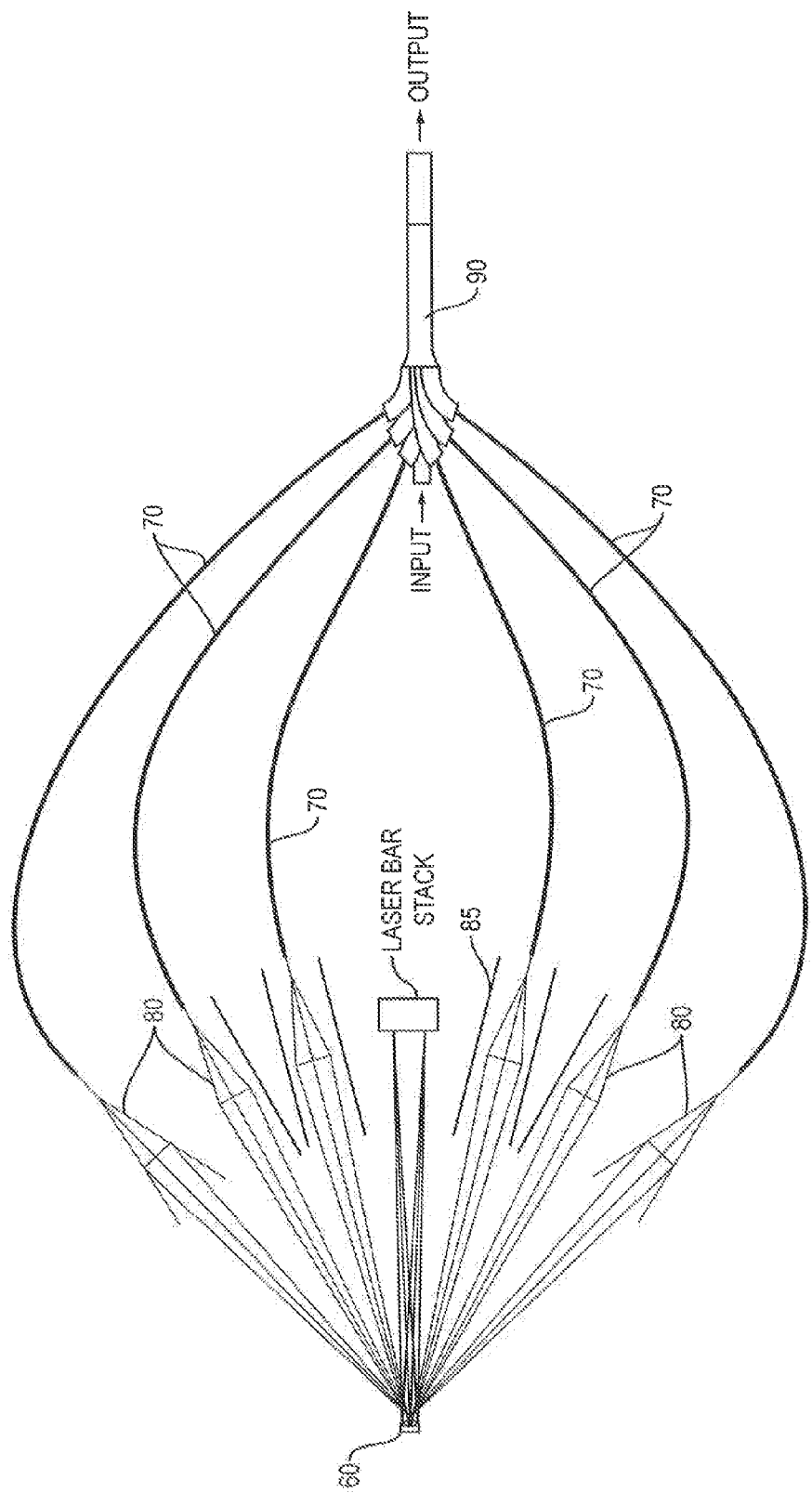

One embodiment of the system of these teachings is shown in FIGS. 6a, 6b. Referring to FIGS. 6a, 6b, in the embodiment shown therein, radiation from each of the laser diode facets from a laser diode bar stack 20 is substantially collimated by an optical subsystem 40 and a single image is formed, by the optical subsystem 40, onto a number of separately tilted areas 45 from a monolithic reflective component 60, the separately tilted areas separating radiation from the single image into a number of separated reflected beams and directing each one of the separated reflected beams in a different one of a number of different directions. Another optical subsystem 80 images each one of the separated reflected beams into a numerical aperture of a separate one optical fiber 70 from a group of optical fibers 70. The optical fibers 70 transfer radiation optically imaged into the numerical aperture of the input end of each fiber in order to pump an active area of a laser 90. In one instance, the laser being pumped is a fiber laser and the radiation is transferred to an active fiber.

An advantage of this invention is that the pump radiation source is a single laser bar stack, for simplicity of manufacture, mounting and cooling.

An advantage of this invention is that all free-space optical components, such as image-forming lenses, can be pre-assembled in cylindrical mounts for easy combination into the total system, using vee-groove structures machined under computer control into a single base plate for positioning and attachment with no further angular adjustments and superior stability.

An advantage of these teachings is that the angular configuration of the reflective facets in the special monolithic component are fully determined and fixed in a single machining operation, with no further angular adjustments and superior stability.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although these teachings have been described with respect to various embodiments, it should be realized these teachings are also capable of a wide variety of further and other embodiments within the spirit and scope of the appended claims.

What is claimed is:

1. A system for directing radiation emitted from a combined diode laser structure in order to pump an active area of a laser, the system comprising:

a laser diode bar stack having a number of laser diode facets;

an optical component optically disposed and configured to substantially collimate radiation from each of the laser diode facets and form a single image of a combined far field of radiation;

a monolithic reflective component having a plurality of separately tilted areas; the single image being formed onto the plurality of separately tilted areas; each one tilted area being tilted at an angle with respect to a central axis of the monolithic reflective component, said angle being different from an angle at which another tilted area is tilted; wherein at least some of said plurality of separately tilted areas are arranged in a configuration selected from one of a concave configuration and a convex configuration; the plurality of separately tilted areas separating radiation from the single image into a plurality of separated reflected beams and directing each one of the plurality of separated reflected beams in a different one of a plurality of different directions;

a plurality of optical fibers; and an optical subsystem optically disposed to image each one of the plurality of separated reflected beams into a numerical aperture of a separate one optical fiber from the plurality of optical fibers; the optical subsystem comprising a plurality of independent optical subsystem, each independent optical subsystem imaging one of the plurality of separated reflected beams into the numerical aperture of one optical fiber.

2. The system of claim 1 wherein the plurality of optical fibers is configured to transfer radiation optically imaged into the numerical aperture of an input end of each separate one optical fiber in order to pump an active area of a laser.

3. The system of claim 2 wherein the laser is a fiber laser and the active area is an active fiber.

4. The system of claim 1 wherein the at least some of said plurality of separately tilted areas are arranged in the concave configuration.

5. The system of claim 1 wherein the at least some of said plurality of separately tilted areas are arranged in the convex configuration.

6. The system of claim 1 wherein said optical subsystem images a near field of each one separated reflected beam onto a receiving core of each separate one optical fiber.

7. The system of claim 1 wherein said optical subsystem images a far field of each one separated reflected beam onto a receiving core of each separate one optical fiber.

8. A method for directing radiation emitted from a combined diode laser structure in order to apply high pumping power to an active area of a laser, the method comprising:

separating, by means of a monolithic reflective component having a plurality of separately tilted reflective areas, collimated electromagnetic radiation of a combined far field of radiation from a laser diode bar stack into a plurality of separated reflected beams; each one tilted area being tilted at an angle with respect to a central axis of the monolithic reflective component, said angle being different from an angle at which another tilted area is tilted; wherein at least some of said plurality of separately tilted areas are arranged in a configuration selected from one of a concave configuration and a convex configuration;

directing, by means of the plurality of separately tilted reflective areas, each one separated reflected beam from the plurality of separated reflected beams in a different one of a plurality of different directions; and optically imaging said each one separated reflected beam from the plurality of separated reflected beams into a numerical aperture of an input end of a separate one optical fiber from a plurality of optical fibers.

9. The method of claim 8 further comprising transferring radiation optically imaged into the numerical aperture of the input end of each optical fiber from the plurality of optical fibers to an active area of the laser in order to pump the active area of the laser.

10. The method of claim 9 wherein the laser is a fiber laser and the active area is an active fiber.

11. The method of claim 8, wherein, in separating the collimated electromagnetic radiation, at least some of said plurality of separately tilted reflective areas are arranged in the concave configuration.

12. The method of claim 8, wherein, in separating the collimated electromagnetic radiation, at least some of said plurality of separately tilted reflective areas are arranged in the convex configuration.

13. The method of claim 8, wherein, in optically imaging said each one separated reflected beam, a near field of said each one separated reflected beam is imaged onto a receiving core of each separate one optical fiber.

14. The method of claim 8, wherein, in optically imaging said each one separated reflected beam, a far field of said each one separated reflected beam is imaged onto a receiving core of each separate one optical fiber.

* * * * *